(12) United States Patent
Hayashi et al.

(10) Patent No.: US 8,608,856 B2
(45) Date of Patent: Dec. 17, 2013

(54) SEALING PART AND SUBSTRATE PROCESSING APPARATUS

(75) Inventors: Daisuke Hayashi, Nirasaki (JP); Akira Muramatsu, Shinjuku-ku (JP)

(73) Assignees: Tokyo Electron Limited, Tokyo (JP); Nippon Valqua Industries, Ltd., Tokyo (JP)

( * ) Notice: Subject to any disclaimer, the term of this patent is extended or adjusted under 35 U.S.C. 154(b) by 1726 days.

(21) Appl. No.: 11/407,079

(22) Filed: Apr. 20, 2006

(65) Prior Publication Data

US 2007/0075503 A1  Apr. 5, 2007

Related U.S. Application Data

(60) Provisional application No. 60/776,192, filed on Feb. 24, 2006, provisional application No. 60/731,282, filed on Oct. 31, 2005.

(30) Foreign Application Priority Data

Sep. 30, 2005 (JP) .................................. 2005-288357
Jan. 10, 2006 (JP) .................................. 2006-003059

(51) Int. Cl.
*C23C 16/00* (2006.01)
*H01L 21/3065* (2006.01)
*F16J 15/02* (2006.01)
*F16J 15/10* (2006.01)

(52) U.S. Cl.
USPC ........... 118/733; 277/647; 277/650; 277/652; 277/913; 277/915; 277/944; 277/945; 277/946

(58) Field of Classification Search
USPC .......... 118/733; 277/647, 650, 652, 913, 915, 277/944, 945, 946
See application file for complete search history.

(56) References Cited

U.S. PATENT DOCUMENTS

| | | | | | |
|---|---|---|---|---|---|
| 3,848,880 | A | * | 11/1974 | Tanner | 277/584 |
| 3,915,462 | A | * | 10/1975 | Bruns et al. | 277/647 |
| 3,918,726 | A | * | 11/1975 | Kramer | 277/651 |
| 4,577,874 | A | * | 3/1986 | Zitting | 277/584 |

(Continued)

FOREIGN PATENT DOCUMENTS

| | | |
|---|---|---|
| JP | 4-84971 | 7/1992 |
| JP | 2004-186329 | 7/2004 |

(Continued)

*Primary Examiner* — Jeffrie R Lund
(74) *Attorney, Agent, or Firm* — Oblon, Spivak, McClelland, Maier & Neustadt, L.L.P.

(57) ABSTRACT

A sealing part that is inexpensive and enable excellent durability to be secured without the need for a predetermined sealing space as would be required for a double sealing structure. A sealing part seals an inside of a reduced pressure vessel from an outside, in which a high-elasticity polymeric material-eroding eroding substance is present and which is comprised of a substrate processing apparatus carrying out predetermined processing on a substrate housed in the reduced pressure vessel. The sealing part has a radical sealing member and a vacuum sealing member. The radical sealing member is disposed on an inside side of the reduced pressure vessel and is resistant to the eroding substance. The vacuum sealing member is made of the high-elasticity polymeric material and is disposed on an outside side of the reduced pressure vessel. At least one refuge space is formed through at least part of the radical sealing member and at least part of the vacuum sealing member being separated from one another. The radical sealing member and the vacuum sealing member are fitted together.

20 Claims, 7 Drawing Sheets

(56) References Cited

U.S. PATENT DOCUMENTS

| | | | |
|---|---|---|---|
| 4,702,482 A * | 10/1987 | Oseman | 277/556 |
| 5,172,921 A * | 12/1992 | Stenlund | 277/300 |
| 5,536,018 A * | 7/1996 | Szott | 277/313 |
| 5,538,262 A * | 7/1996 | Matsumura | 277/608 |
| 6,286,839 B1 * | 9/2001 | Mitsui et al. | 277/603 |
| 6,305,483 B1 * | 10/2001 | Portwood | 175/371 |
| 6,357,759 B1 * | 3/2002 | Azuma et al. | 277/602 |
| 6,689,221 B2 | 2/2004 | Ryding et al. | |
| 6,802,513 B2 * | 10/2004 | Ranzau | 277/641 |
| 6,905,125 B2 * | 6/2005 | Shibata et al. | 277/626 |
| 7,160,393 B2 * | 1/2007 | Takahashi | 118/733 |
| 7,195,246 B2 * | 3/2007 | Aoshiba et al. | 277/438 |
| 7,195,469 B2 * | 3/2007 | Tsuchiya et al. | 418/55.4 |
| 7,866,669 B2 * | 1/2011 | Kobayashi et al. | 277/584 |
| 7,896,354 B2 * | 3/2011 | Muramatsu | 277/584 |
| 7,942,425 B2 * | 5/2011 | Shojima | 277/652 |
| 2004/0187781 A1 * | 9/2004 | Takahashi | 118/715 |
| 2004/0188120 A1 * | 9/2004 | Komatsu et al. | 174/17 CT |
| 2007/0075503 A1 * | 4/2007 | Hayashi et al. | 277/589 |
| 2008/0018058 A1 * | 1/2008 | Kobayashi et al. | 277/650 |
| 2009/0174152 A1 * | 7/2009 | Muramatsu | 277/562 |

FOREIGN PATENT DOCUMENTS

| | | |
|---|---|---|
| JP | 2005-164027 | 6/2005 |
| KR | 1999-0076702 | 10/1999 |
| KR | 2001-0017441 | 3/2001 |

* cited by examiner

SEALING PART AND SUBSTRATE PROCESSING APPARATUS

BACKGROUND OF THE INVENTION

1. Field of the Invention

The present invention relates to a sealing part and a substrate processing apparatus, and in particular relates to a sealing part used in a substrate processing apparatus that forms a plasma from a reactive active gas and processes a substrate using the plasma.

2. Description of the Related Art

A plasma processing apparatus that carries out plasma processing such as etching on semiconductor wafers as substrates has a vacuum chamber the pressure inside of which can be reduced down substantially to a vacuum. The etching is carried out on a semiconductor wafer housed in the vacuum chamber using a processing gas that is turned into a plasma in the vacuum chamber. In such a plasma processing apparatus, a ring-shaped sealing part is used to seal the inside of the vacuum chamber (the vacuum) from the outside (the atmosphere) (see, for example, U.S. Pat. No. 6,689,221). In particular, for an etching apparatus as the plasma processing apparatus, the semiconductor wafer becomes hot due to receiving energy from the plasma, and hence an O-ring made of a heat-resistant fluoro-rubber is used as the sealing part.

In recent years, etching in which a mixed gas containing a reactive active gas (e.g. a $C_xF_y$ gas such as $C_4F_8$ gas) is used as the processing gas so that the etch rate is controlled by reaction by-products has become the mainstream. In such etching, when the reactive active gas is turned into the plasma, depositable active species such as fluorine radicals are produced.

Moreover, in etching using a reactive active gas, reaction by-products become attached to the inner wall of the vacuum chamber. The attached reaction by-products are stripped off to become particles, which become attached to semiconductor devices on the semiconductor wafer, bringing about a decrease in the semiconductor device yield. Dry cleaning is thus carried out to remove attached reaction by-products in the plasma processing apparatus. For example, WLDC (wafer-less dry cleaning), which is one type of dry cleaning, may be carried out. In the WLDC, the reaction by-products are removed by oxygen ions produced from oxygen gas. However, oxygen radicals are also produced at the same time.

The above fluoro-rubber is readily worn away by radicals (fluorine radicals and/or oxygen radicals). In a plasma processing apparatus in which a reactive active gas is used, a double sealing structure comprised of an O-ring-shaped sealing part (RTR (radical trap ring)) made of a radical-resistant fluororesin (specifically Teflon (registered trademark)) disposed on the vacuum side, and an O-ring made of a fluororubber (specifically a vinylidene fluoride type rubber (FKM)) disposed on the atmosphere side is thus used. The RTR is comprised of a Teflon (registered trademark) tube, and rubber filled into the tube.

According to such a double sealing structure, the RTR seals in the radicals so that the radicals do not leak out from the vacuum side, and the fluoro-rubber O-ring seals the vacuum in the vacuum chamber from the outside atmosphere. For the double sealing structure, two sealing grooves for housing the RTR and the fluoro-rubber O-ring respectively are required, and hence a predetermined sealing space is required.

However, conventional plasma processing apparatuses have not been designed assuming the use of a double sealing structure, and hence the predetermined sealing space cannot be secured, and thus using a double sealing structure as described above in a conventional plasma processing apparatus is difficult. In particular, with a KF flange joint structure used for joining two pipes (JIS G 5526), providing two sealing grooves is structurally impossible, and hence a double sealing structure as described above cannot be used.

In the case that a double sealing structure cannot be used, an O-ring made of a radical-resistant fluoro-rubber (specifically a tetrafluoroethylene-perfluorovinyl ether rubber (FFKM)) is used, but FFKM is very expensive, and moreover has a poorer radical resistance than Teflon (registered trademark). In particular, in recent years, it has come to be strongly demanded for plasma processing apparatuses to have a long lifetime, and hence with FFKM a durability satisfying the requirements of plasma processing apparatus users cannot be secured.

SUMMARY OF THE INVENTION

It is an object of the present invention to provide a sealing part and a substrate processing apparatus that are inexpensive and enable excellent durability to be secured without the need for a predetermined sealing space as would be required for a double sealing structure.

To attain the above object, in a first aspect of the present invention, there is provided a sealing part in a substrate processing apparatus that has a reduced pressure vessel in which is present a high-elasticity polymeric material-eroding eroding substance and carries out predetermined processing on a substrate housed in the reduced pressure vessel, the sealing part sealing an inside of the reduced pressure vessel from an outside, the sealing part comprising a first member that is disposed on an inside side of the reduced pressure vessel and is resistant to the eroding substance, a second member made of the high-elasticity polymeric material that is disposed on an outside side of the reduced pressure vessel, and at least one predetermined space formed through at least part of the first member and at least part of the second member being separated from one another, wherein the first member and the second member are fitted together.

According to the above sealing part, the sealing part has a first member that is disposed on the inside side of the reduced pressure vessel and is resistant to the high-elasticity polymeric material-eroding eroding substance, and a second member made of the high-elasticity polymeric material that is disposed on the outside side of the reduced pressure vessel. Consequently, erosion of the second member can be prevented by the first member, whereby the need to use a high-elasticity polymeric material that is resistant to the eroding substance can be eliminated. Moreover, the sealing part has at least one predetermined space formed through at least part of the first member and at least part of the second member being separated from one another. Consequently, part of the second member can enter into the predetermined space when the second member undergoes compressive deformation, whereby the second member can undergo the compressive deformation easily. Furthermore, the first member and the second member are fitted together. Consequently, the sealing part can be handled as a single body, and moreover can be made small in size. As a result, the sealing part does not require a predetermined sealing space as would be required for a double sealing structure, the sealing part is inexpensive, and excellent durability can be secured.

Preferably, the first member has a substantially U-shaped cross section that opens out on the outside side, and at least part of the second member enters into the opening of the U-shaped cross section.

According to the above sealing part, the first member has a substantially U-shaped cross section that opens out on the outside side, and at least part of the second member enters into the opening of the U-shaped cross section. Consequently, even if the recoverability of the first member decreases through creeping or yielding, the first member can be made to recover through a recoil force from the entered second member. As a result, durability can be maintained over a long time period.

More preferably, the U-shaped cross section of the first member has at least one bending portion therein.

According to the above sealing part, the U-shaped cross section of the first member has at least one bending portion therein. Consequently, the first member can undergo compressive deformation easily. As a result, the following ability of the first member can be improved, and hence excellent durability can be secured, and moreover the compressive loads on the first member and the second member can be reduced.

Yet more preferably, the bending portion is a narrow portion.

According to the above sealing part, the bending portion is a narrow portion. As a result, the effects of the above preferable aspect can be achieved reliably.

Also preferably, the eroding substance is an active species produced from a reactive active gas, and the first member is made of a fluororesin.

According to the above sealing part, the eroding substance is an active species produced from a reactive active gas, and the first member is made of a fluororesin. Such a fluororesin is hardly eroded by such an active species. As a result, erosion of the high-elasticity polymeric material constituting the second member by the active species can be reliably prevented, and hence yet better durability can be secured.

More preferably, the fluororesin is one selected from the group consisting of polytetrafluoroethylene, a tetrafluoroethylene/perfluoroalkyl vinyl ether copolymer, a tetrafluoroethylene/hexafluoropropylene copolymer, a tetrafluoroethylene/ethylene copolymer, polyvinylidene fluoride, and polychlorotrifluoroethylene.

According to the above sealing part, the fluororesin is one selected from the group consisting of polytetrafluoroethylene, a tetrafluoroethylene/perfluoroalkyl vinyl ether copolymer, a tetrafluoroethylene/hexafluoropropylene copolymer, a tetrafluoroethylene/ethylene copolymer, polyvinylidene fluoride, and polychlorotrifluoroethylene. As a result, the material constituting the first member can be procured easily and inexpensively, and hence the sealing part can be made less expensive.

Also more preferably, the high-elasticity polymeric material is one selected from the group consisting of vinylidene fluoride type rubber, and tetrafluoroethylene-propylene type rubber.

According to the above sealing part, the high-elasticity polymeric material is one selected from the group consisting of vinylidene fluoride type rubber, and tetrafluoroethylene-propylene type rubber. As a result, the material constituting the second member can be procured easily and inexpensively, and hence the sealing part can be made less expensive.

Preferably, the eroding substance is a corrosive gas, and the first member is made of a corrosion-resistant metal.

According to the above sealing part, the eroding substance is a corrosive gas, and the first member is made of a corrosion-resistant metal. Such a corrosion-resistant metal is hardly eroded by such a corrosive gas. As a result, erosion of the high-elasticity polymeric material constituting the second member by the corrosive gas can be reliably prevented, and hence yet better durability can be secured.

More preferably, the corrosion-resistant metal is one selected from the group consisting of stainless steel, nickel, and aluminum.

According to the above sealing part, the corrosion-resistant metal is one selected from the group consisting of stainless steel, nickel, and aluminum. As a result, the material constituting the first member can be procured easily and inexpensively, and hence the sealing part can be made less expensive.

Also more preferably, the high-elasticity polymeric material is one selected from the group consisting of vinylidene fluoride type rubber, and tetrafluoroethylene-propylene type rubber.

According to the above sealing part, the high-elasticity polymeric material is one selected from the group consisting of vinylidene fluoride type rubber, and tetrafluoroethylene-propylene type rubber. As a result, the material constituting the second member can be procured easily and inexpensively, and hence the sealing part can be made less expensive.

Preferably, the second member has a neck portion.

According to the above sealing part, the second member has a neck portion. As a result, the following ability of the second member can be improved, and hence the shielding performance can be improved.

To attain the above object, in a second aspect of the present invention, there is provided a substrate processing apparatus comprising a reduced pressure vessel in which is present a high-elasticity polymeric material-eroding eroding substance, a processing apparatus that carries out predetermined processing on a substrate housed in the reduced pressure vessel, and a sealing part that seals an inside of the reduced pressure vessel from an outside, wherein the sealing part has a first member that is disposed on an inside side of the reduced pressure vessel and is resistant to the eroding substance, a second member made of the high-elasticity polymeric material that is disposed on an outside side of the reduced pressure vessel, and at least one predetermined space formed through at least part of the first member and at least part of the second member being separated from one another, the first member and the second member being fitted together.

According to the above substrate processing apparatus, effects as for the first aspect can be achieved.

Preferably, the first member has a substantially U-shaped cross section that opens out on the outside side, and at least part of the second member enters into the opening of the U-shaped cross section.

According to the above substrate processing apparatus, the first member has a substantially U-shaped cross section that opens out on the outside side, and at least part of the second member enters into the opening of the U-shaped cross section. Consequently, even if the recoverability of the first member decreases through creeping or yielding, the first member can be made to recover through a recoil force from the entered second member. As a result, durability can be maintained over a long time period.

Also preferably, the eroding substance is an active species produced from a reactive active gas, and the first member is made of a fluororesin.

According to the above substrate processing apparatus, the eroding substance is an active species produced from a reactive active gas, and the first member is made of a fluororesin. Such a fluororesin is hardly eroded by such an active species. As a result, erosion of the high-elasticity polymeric material constituting the second member by the active species can be reliably prevented, and hence yet better durability can be secured.

Preferably, the eroding substance is a corrosive gas, and the first member is made of a corrosion-resistant metal.

According to the above substrate processing apparatus, the eroding substance is a corrosive gas, and the first member is made of a corrosion-resistant metal. Such a corrosion-resistant metal is hardly eroded by such a corrosive gas. As a result, erosion of the high-elasticity polymeric material constituting the second member by the corrosive gas can be reliably prevented, and hence yet better durability can be secured.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

First, a sealing part and a substrate processing apparatus according to a first embodiment of the present invention will be described. The substrate processing apparatus is constructed such as to carry out predetermined processing on substrates using a reactive active gas.

Figure 1:
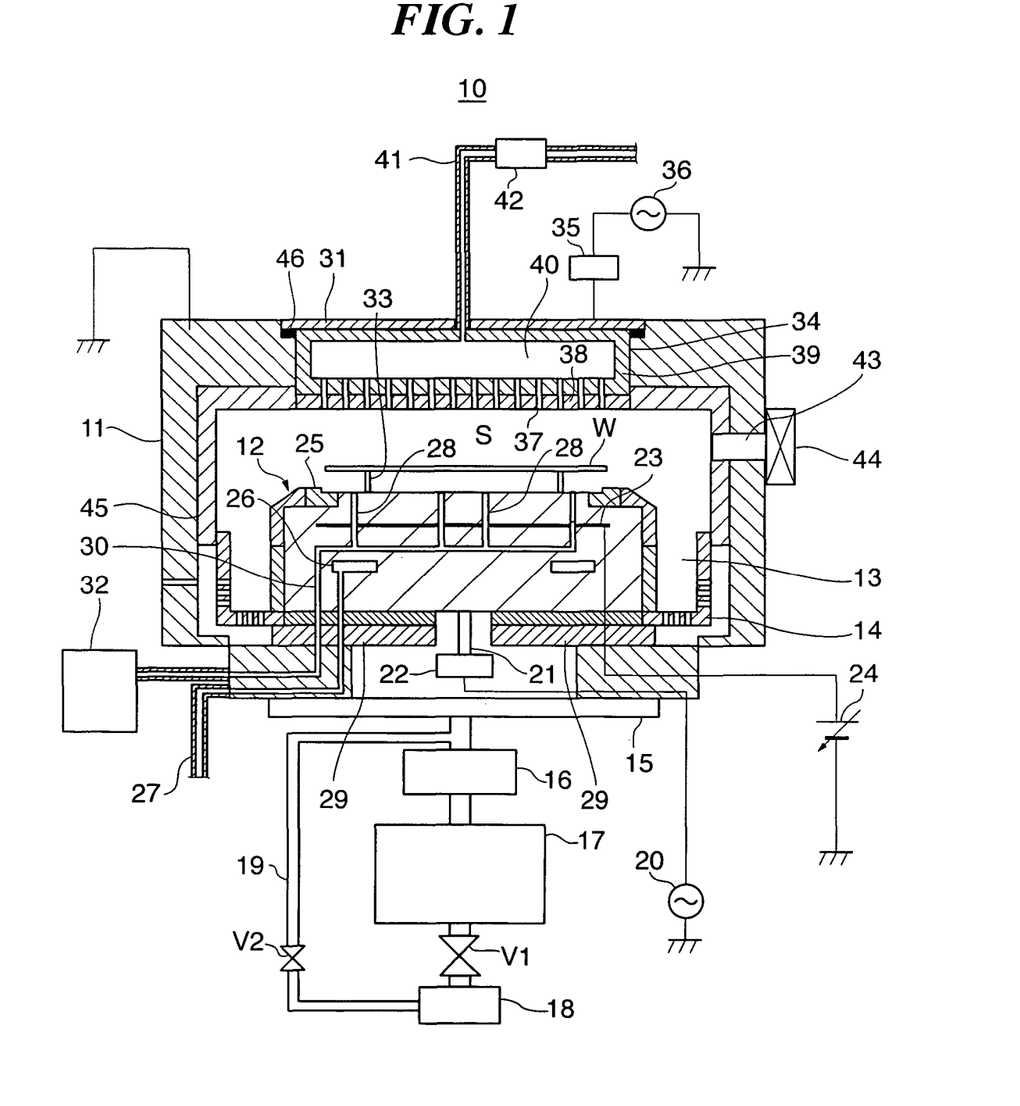
FIG. 1 is a sectional view schematically showing the construction of a plasma processing apparatus as a substrate processing apparatus according to a first embodiment of the present invention.

FIG. 1 is a sectional view schematically showing the construction of a plasma processing apparatus as the substrate processing apparatus according to the present embodiment. The plasma processing apparatus carries out RIE (reactive ion etching) on semiconductor wafers W as substrates, and moreover is constructed such that WLDC can also be implemented.

As shown in FIG. 1, the plasma processing apparatus 10 has a cylindrical vacuum vessel 11 (reduced pressure vessel), and the vacuum vessel 11 has a processing space S therein. A cylindrical susceptor 12 is disposed in the vacuum vessel 11 as a stage on which is mounted a semiconductor wafer W (hereinafter referred to merely as the "wafer W") having a diameter of, for example, 300 mm. An inner wall of the vacuum vessel 11 is covered with a side wall member 45. The side wall member 45 is made of aluminum, a surface thereof facing the processing space S being coated with a ceramic such as yttria ($Y_2O_3$). Moreover, the vacuum vessel 11 is electrically grounded, and the susceptor 12 is installed in a bottom portion of the vacuum vessel 11 via an insulating member 29.

In the plasma processing apparatus 10, an exhaust path 13 that acts as a flow path through which gas molecules above the susceptor 12 are discharged to the outside of the vacuum vessel 11 is formed between the inner wall of the vacuum vessel 11 and a side face of the susceptor 12. An annular baffle plate 14 that prevents leakage of plasma is disposed part way along the exhaust path 13. A space in the exhaust path 13 downstream of the baffle plate 14 bends round below the susceptor 12, and is communicated with an adaptive pressure control valve (hereinafter referred to as the "APC valve") 15, which is a variable butterfly valve. The APC valve 15 is connected to a turbo-molecular pump (hereinafter referred to as the "TMP") 17, which is an exhausting pump for evacuation, via an isolator 16, and the TMP 17 is connected to a dry pump (hereinafter referred to as the "DP") 18, which is also an exhausting pump, via a valve V1. The exhaust flow path comprised of the APC valve 15, the isolator 16, the TMP 17, the valve V1 and the DP 18 (hereinafter referred to as the "main exhaust line") is used for controlling the pressure in the vacuum vessel 11 using the APC valve 15, and also for reducing the pressure in the vacuum vessel 11 down to a substantially vacuum state using the TMP 17 and the DP 18.

Moreover, piping 19 is connected from between the isolator 16 and the APC valve 15 to the DP 18 via a valve V2. The exhaust flow path comprised of the piping 19 and the valve V2 (hereinafter referred to as the "bypass line") bypasses the isolator 16 and the DP 17, and is used for roughing the vacuum vessel 11 using the DP 18.

A lower electrode high-frequency power source 20 is connected to the susceptor 12 via a feeder rod 21 and a matcher 22. The lower electrode high-frequency power source 20 supplies predetermined high-frequency electrical power to the susceptor 12. The susceptor 12 thus acts as a lower electrode. The matcher 22 reduces reflection of the high-frequency electrical power from the susceptor 12 so as to maximize the efficiency of the supply of the high-frequency electrical power into the susceptor 12.

A disk-shaped ESC electrode plate 23 comprised of an electrically conductive film is provided in an upper portion of the susceptor 12. A DC power source 24 is electrically connected to the ESC electrode plate 23. A wafer W is attracted to and held on an upper surface of the susceptor 12 through a Johnsen-Rahbek force or a Coulomb force generated by a DC voltage applied to the ESC electrode plate 23 from the DC power source 24. Moreover, an annular focus ring 25 is provided on the upper portion of the susceptor 12 so as to surround the wafer W attracted to and held on the upper surface of the susceptor 12. The focus ring 25 is exposed to the processing space S, and focuses the plasma in the processing space S toward a surface of the wafer W, thus improving the efficiency of the RIE.

An annular coolant chamber 26 that extends, for example, in a circumferential direction of the susceptor 12 is provided inside the susceptor 12. A coolant, for example cooling water or a Galden (registered trademark) fluid, at a predetermined temperature is circulated through the coolant chamber 26 via coolant piping 27 from a chiller unit (not shown). A processing temperature of the wafer W attracted to and held on the upper surface of the susceptor 12 is controlled through the temperature of the coolant.

A plurality of heat-transmitting gas supply holes 28 are provided in a portion of the upper surface of the susceptor 12 on which the wafer W is attracted and held (hereinafter referred to as the "attracting surface"). The heat-transmitting gas supply holes 28 are connected to a heat-transmitting gas supply unit 32 by a heat-transmitting gas supply line 30 provided inside the susceptor 12. The heat-transmitting gas supply unit 32 supplies helium gas as a heat-transmitting gas via the heat-transmitting gas supply holes 28 into a gap between the attracting surface of the susceptor 12 and a backside surface of the wafer W.

A plurality of pusher pins 33 are provided in the attracting surface of the susceptor 12 as lifting pins that can be made to project out from the upper surface of the susceptor 12. The pusher pins 33 are connected to a motor (not shown) by a ball screw (not shown), and can be made to project out from the attracting surface of the susceptor 12 through rotational motion of the motor, which is converted into linear motion by the ball screw. The pusher pins 33 are housed inside the susceptor 12 when a wafer W is being attracted to and held on the attracting surface of the susceptor 12 so that the wafer W can be subjected to the RIE, and are made to project out from the upper surface of the susceptor 12 so as to lift the wafer W up away from the susceptor 12 when the wafer W is to be transferred out from the vacuum vessel 11 after having been subjected to the RIE.

A gas introducing shower head 34 is disposed in a ceiling portion of the vacuum vessel 11 facing the susceptor 12. An upper electrode high-frequency power source 36 is connected to the gas introducing shower head 34 via a matcher 35. The upper electrode high-frequency power source 36 supplies predetermined high-frequency electrical power to the gas introducing shower head 34. The gas introducing shower head 34 thus acts as an upper electrode. The matcher 35 has a similar function to the matcher 22, described earlier.

The gas introducing shower head 34 has a ceiling electrode plate 38 having a large number of gas holes 37 therein, and an electrode support 39 on which the ceiling electrode plate 38 is detachably supported. A buffer chamber 40 is provided inside the electrode support 39. A processing gas introducing pipe 41 is connected from a processing gas supply unit (not shown) to the buffer chamber 40. A piping insulator 42 is disposed part way along the processing gas introducing pipe 41. The piping insulator 42 is made of an electrically insulating material, and prevents the high-frequency electrical power supplied to the gas introducing shower head 34 from leaking into the processing gas supply unit via the processing gas introducing pipe 41. A processing gas, for example a mixed gas of $C_xF_y$ gas as a reactive active gas and argon (Ar) gas, supplied from the processing gas introducing pipe 41 into the buffer chamber 40 is supplied by the gas introducing shower head 34 into the vacuum vessel 11 (the processing space S) via the gas holes 37.

The plasma processing apparatus 10 has a vessel lid 31 provided in an upper portion of the vacuum vessel 11. The vessel lid 31 covers the gas introducing shower head 34. To seal the inside of the vacuum vessel 11 from the outside, an O-ring-shaped sealing part 46 is provided between the vessel lid 31 and the vacuum vessel 11 so as to surround the gas introducing shower head 34.

A transfer port 43 for the wafers W is provided in a side wall of the vacuum vessel 11 in a position at the height of a wafer W that has been lifted up from the susceptor 12 by the pusher pins 33. A gate valve 44 for opening and closing the transfer port 43 is provided in the transfer port 43.

Upon supplying high-frequency electrical power to the susceptor 12 and the gas introducing shower head 34 in the vacuum vessel 11 of the plasma processing apparatus 10 as described above, and thus applying high-frequency electrical power into the processing space S between the susceptor 12 and the gas introducing shower head 34, the mixed gas (processing gas) supplied from the gas introducing shower head 34 into the processing space S is turned into a plasma, and hence ions are produced; the wafer W is subjected to the RIE by the ions. At this time, the etch rate is controlled by reaction by-products produced from the $C_xF_y$ gas (the reactive active gas) in the mixed gas. Fluorine radicals are also produced as depositable active species when the ions are produced.

Operation of the component elements of the plasma processing apparatus 10 described above is controlled in accordance with a program for the RIE by a CPU of a control unit (not shown) of the plasma processing apparatus 10.

Figure 2:
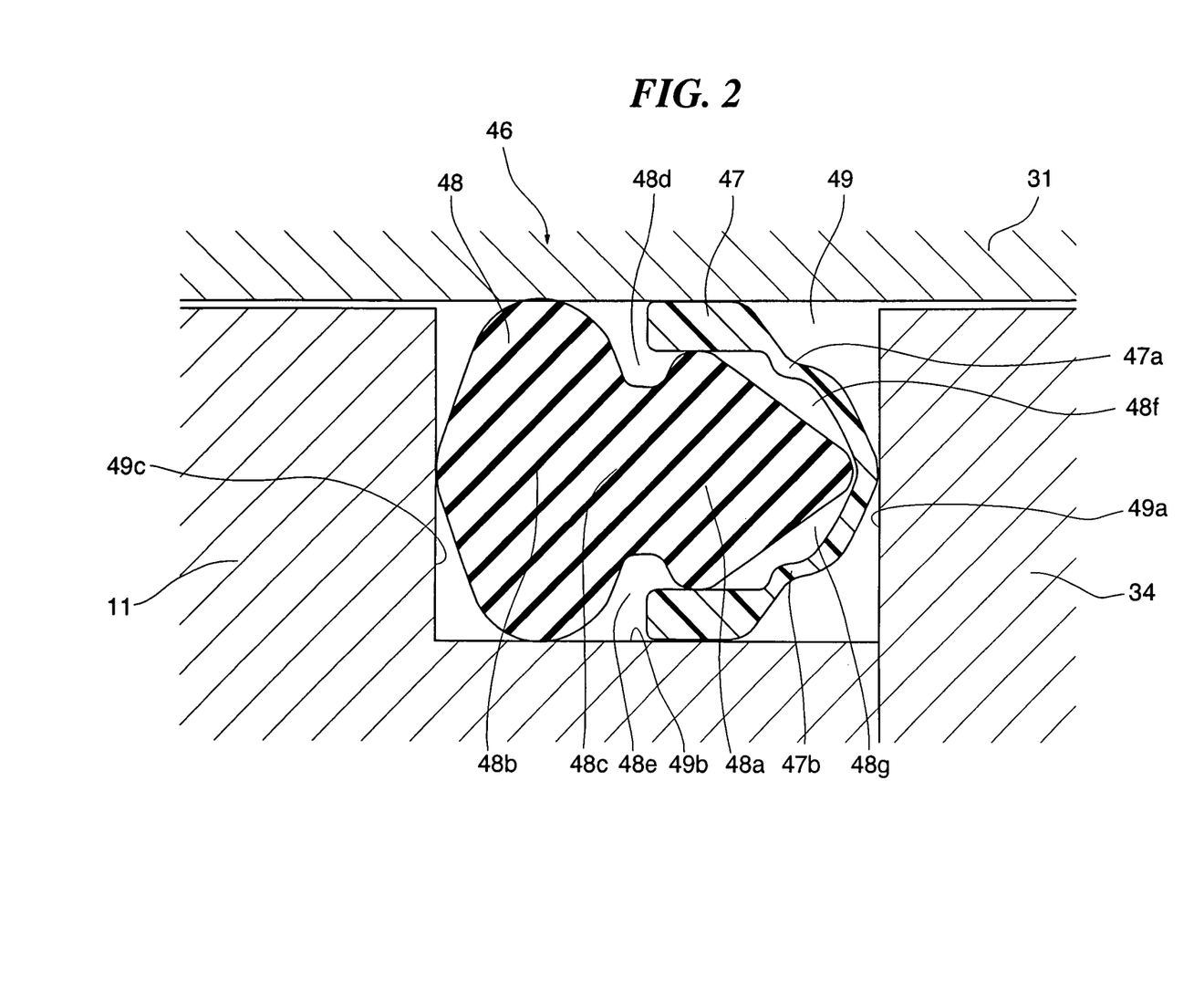
FIG. 2 is an enlarged sectional view of an O-ring-shaped sealing part appearing in FIG. 1.

FIG. 2 is an enlarged sectional view of the O-ring-shaped sealing part 46 appearing in FIG. 1. Note that the gas introducing shower head 34 is located at the top of the drawing, and hence the inside of the vacuum vessel 11 is to the top of the paper. Hereinafter, the region to the top of the drawing will thus be referred to as "the inside (vacuum) side", and the region to the bottom of the drawing as "the outside (atmosphere) side". Moreover, the up/down direction in the drawing will be referred to as the "horizontal direction", and the left/right direction in the drawing as the "vertical direction".

As shown in FIG. 2, the sealing part 46 has a radical sealing member 47 having a substantially U-shaped cross section that opens out on the atmosphere side, and a vacuum sealing member 48 having a substantially gourd-shaped, i.e. in which necks are formed, cross section oriented in the horizontal direction. The radical sealing member 47 is disposed on the inside (vacuum) side, and the vacuum sealing member 48 on the outside (atmosphere) side. The radical sealing member 47 is made of polytetrafluoroethylene (PTFE), which is a fluororesin, and the vacuum sealing member 48 is made of FKM.

The sealing part 46 is housed in a space defined by the vessel lid 31, and a sealing groove 49 having a rectangular cross section formed in the vacuum vessel 11. The vessel lid 31 is disposed above the sealing part 46, the vessel lid 31 contacting an upper portion of the sealing part 46. Specifically, a bottom face 49b of the sealing groove 49 contacts the radical sealing member 47 and the vacuum sealing member 48, and the vessel lid 31 also contacts the radical sealing member 47 and the vacuum sealing member 48.

The distance between the vessel lid 31 and the bottom face 49b of the sealing groove 49 is set to be shorter by a predetermined length than the natural length of the radical sealing member 47 in the vertical direction and the natural length of the vacuum sealing member 48 in the vertical direction, whereby when the sealing part 46 is housed in the space defined by the sealing groove 49 and the vessel lid 31, the radical sealing member 47 and the vacuum sealing member 48 are each compressed in the vertical direction. As a result, each of the radical sealing member 47 and the vacuum sealing member 48 produces a recoil force, and hence each of the radical sealing member 47 and the vacuum sealing member 48 is made to be in close contact with both the vessel lid 31 and the bottom face 49b of the sealing groove 49 due to the recoil force.

The radical sealing member 47 has a radical sealing narrow portion 47a between a portion of the radical sealing member 47 contacting the vessel lid 31 and a portion of the radical sealing member 47 contacting a vacuum-side side face 49a of the sealing groove 49, and has a radical sealing narrow portion 47b between the portion of the radical sealing member 47 contacting the vacuum-side side face 49a of the sealing groove 49 and a portion of the radical sealing member 47 contacting the bottom face 49b of the sealing groove 49. The radical sealing narrow portions 47a and 47b have low rigidity, and hence promote compressive deformation of the radical sealing member 47. That is, the radical sealing narrow portions 47a and 47b are bending portions; upon the radical sealing member 47 being compressed in the vertical direction, the radical sealing member 47 bends at the radical sealing narrow portions 47a and 47b so as to undergo compressive deformation.

Due to having the substantially gourd-shaped cross section as described above, the vacuum sealing member 48 has a vacuum-side lump portion 48a, an atmosphere-side lump portion 48b, and a vacuum sealing narrow portion 48c connecting the vacuum-side lump portion 48a and the atmosphere-side lump portion 48b. Part of the radical sealing member 47 and part of the vacuum sealing member 48 (specifically the front portion of the vacuum-side lump portion 48a, rear portion of the atmosphere-side lump portion 48b, and the upper and lower portions of the vacuum sealing narrow portion 48c) are separated from one another so as to form two refuge spaces 48d and 48e. That is, the vacuum sealing narrow portion 48c forms a neck portion in the vacuum sealing member 48.

The vacuum-side lump portion 48a of the vacuum sealing member 48 is press-fitted into the opening of the substantially U-shaped cross section of the radical sealing member 47. As a result, the radical sealing member 47 and the vacuum sealing member 48 are fitted together. Moreover, part of the vacuum-side lump portion 48a of the vacuum sealing member 48 is separated from the radical sealing narrow portion 47a, and part of the vacuum-side lump portion 48a of the vacuum sealing member 48 is separated from the radical sealing narrow portion 47b, so as to form refuge spaces 48f and 48g.

Portions protruding out from the vacuum sealing member 48 when the vacuum sealing member 48 is compressed in the vertical direction enter into the refuge spaces 48d, 48e, 48f and 48g located around the perimeter of the vacuum sealing member 48 as described above, whereby the refuge spaces 48d, 48e, 48f and 48g promote compressive deformation of the vacuum sealing member 48.

Next, the specific shape of the sealing part 46 will be described.

Figure 3:
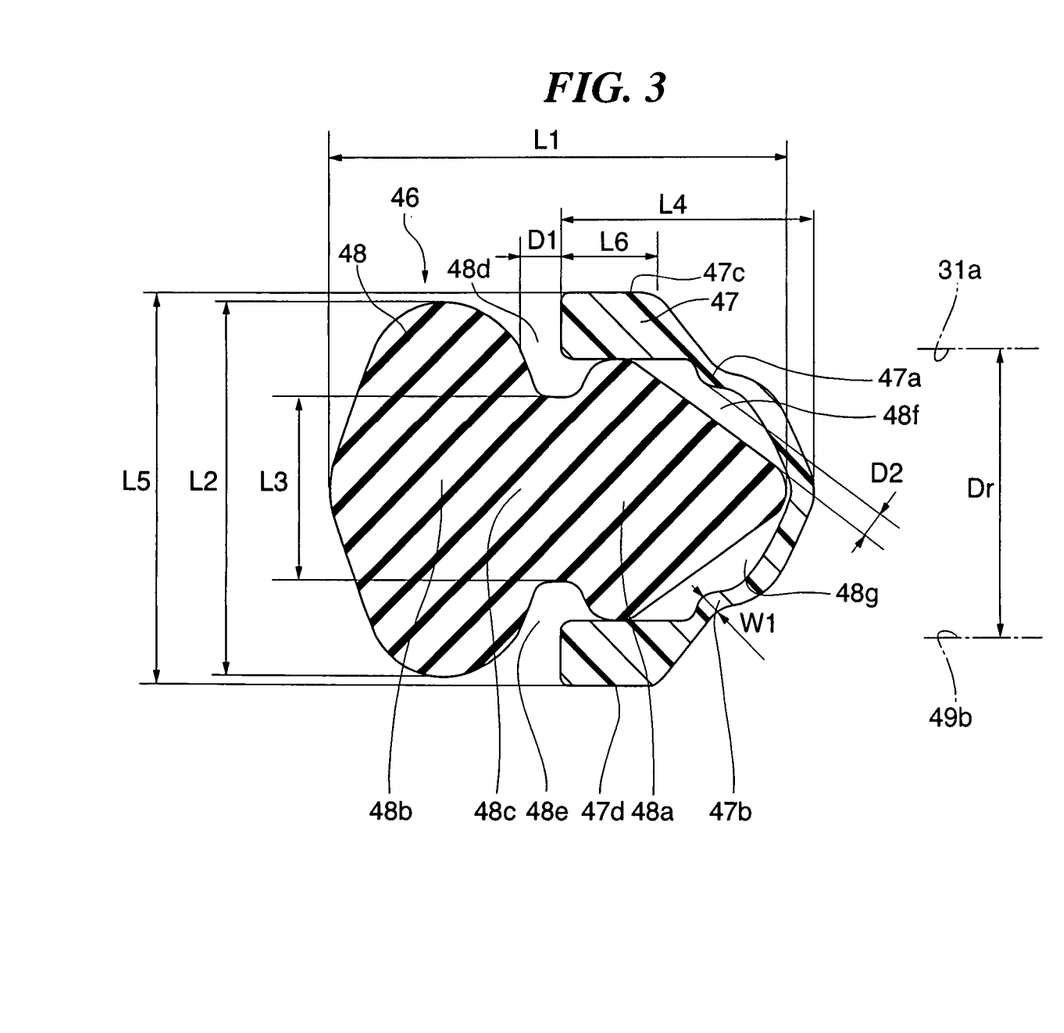
FIG. 3 is a sectional view showing a specific shape of the sealing part shown in FIG. 2.

FIG. 3 is a sectional view showing the specific shape of the sealing part 46 shown in FIG. 2. In FIG. 3, each portion of the sealing part 46 is shown in a natural length state, except the vacuum-side lump portion 48a of the vacuum sealing member 48 which is deformed due to being press-fitted into the opening of the substantially U-shaped cross section of the radical sealing member 47.

As shown in FIG. 3, the vacuum sealing member 48 is formed such that, in its natural length state, the length of the vacuum sealing member 48 in the horizontal direction is L1, the length of the vacuum sealing member 48 in the vertical direction (the height in the vertical direction of the atmosphere-side lump portion 48b) is L2, and the length in the vertical direction (i.e. the width) of the vacuum sealing narrow portion 48c is L3.

The radical sealing member 47 is formed such that, in its natural length state, the length of the radical sealing member 47 in the horizontal direction is L4, the length of the radical sealing member 47 in the vertical direction is L5, and the length of each of a contacting surface 47c contacting the vessel lid 31 and a contacting surface 47d contacting the bottom face 49b of the sealing groove 49 is L6. Moreover, the radical sealing member 47 is formed such that the thickness of each of the radical sealing narrow portions 47a and 47b is W1.

Moreover, the vacuum sealing member 48 and the radical sealing member 47 are formed such that, in the state in which the vacuum-side lump portion 48a of the vacuum sealing member 48 has been press-fitted into the opening of the substantially U-shaped cross section of the radical sealing member 47, the width in the horizontal direction of each of the refuge spaces 48d and 48e is D1, and the minimum width of each of the refuge spaces 48f and 48g is D2. Moreover, the distance between the vessel lid 31 and the bottom face 49b of the sealing groove 49 is Dr.

The horizontal direction length L1 and the vertical direction length L2 of the vacuum sealing member 48, and the horizontal direction length L4 and the vertical direction length L5 of the radical sealing member 47 are set to optimal values relative to the distance Dr between the vessel lid 31 and the bottom face 49b of the sealing groove 49. Specifically, the horizontal direction length L1 of the vacuum sealing member 48 is set to a value satisfying $1.8 \times Dr \geq L1 \geq 0.8 \times Dr$, preferably $1.5 \times Dr \geq L1 \geq 1.2 \times Dr$. The vertical direction length L2 of the vacuum sealing member 48 is set to a value satisfying $1.8 \times Dr \geq L2 \geq 1.05 \times Dr$, preferably $1.5 \times Dr \geq L2 \geq 1.15 \times Dr$. Moreover, the horizontal direction length L4 of the radical sealing member 47 is set to a value satisfying $(5/6) \times L1 \geq L4 \geq (1/6) \times L1$, preferably $(2/3) \times L1 \geq L4 \geq (1/3) \times L1$. The vertical direction length L5 of the radical sealing member 47 is set to a value satisfying $1.8 \times Dr \geq L5 \geq 1.05 \times Dr$, preferably $1.5 \times Dr \geq L5 \geq 1.15 \times Dr$.

The vertical direction length L3 of the vacuum sealing narrow portion 48c is set relative to the vertical direction length L2 of the vacuum sealing member 48, being set to a value satisfying $0.95 \times L2 \geq L3 \geq 0.3 \times L2$, preferably $0.9 \times L2 \geq L3 \geq 0.45 \times L2$. If the vertical direction length L3 of the vacuum sealing narrow portion 48c is high, then the rigidity of the vacuum sealing member 48 at the vacuum sealing narrow portion 48c becomes high, and hence the vacuum sealing member 48 becomes easy to handle. On the other hand, if the vertical direction length L3 of the vacuum sealing narrow portion 48c is low, then the ability of the vacuum sealing member 48 to follow inclination of the vessel lid 31 or the bottom face 49b of the sealing groove 49 is improved.

Because the vacuum sealing narrow portion 48c forms a neck portion in the vacuum sealing member 48 as described above, and due also to the presence of the refuge spaces 48d and 48e, the ability of the vacuum sealing member 48 to follow the vessel lid 31 and the bottom face 49b of the sealing groove 49 can be improved, and hence the sealing performance can be improved.

An upper limit of the length L6 of each of the contacting surfaces 47c and 47d of the radical sealing member 47 is set relative to the horizontal direction length L4 of the radical sealing member 47, L6 being set to a value satisfying $0.6 \times L4 \geq L6 \geq 0.5$ mm, preferably $0.6 \times L4 \geq L6 \geq 1$ mm. By making the contacting surfaces 47c and 47d have such a width (length L6), the shielding performance of the radical sealing member 47 can be made to be stable.

The thickness W1 of each of the radical sealing narrow portions 47a and 47b of the radical sealing 47 is set such that the rigidity of the radical sealing narrow portions 47a and 47b, i.e. the rigidity of the PTFE at the thickness W1, is at a level such that the radical sealing narrow portions 47a and 47b deform through a force not more than the restoring force from the vacuum-side lump portion 48a that has been press-fitted into the opening of the substantially U-shaped cross section of the radical sealing member 47, i.e. the restoring force of the FKM in the state in which the vacuum-side lump portion 48a has been press-fitted. This is so that the radical sealing narrow portions 47a and 47b are pushed upward and downward respectively through the restoring force from the vacuum-side lump portion 48a so that the shielding performance of the radical sealing member 47 to radicals is maintained even in the case that the contacting surfaces 47c and 47d undergo creep. Specifically, the thickness W1 of each of the radical sealing narrow portions 47a and 47b is set to a value satisfying 2.0 mm≥W1≥0.05 mm, preferably 1.5 mm≥W1≥0.1 mm. If the thickness of the radical sealing narrow portions 47a and 47b is less than this thickness W1, then the durability and processability of the radical sealing narrow portions 47a and 47b drop dramatically, and hence good shielding performance to radicals can no longer be obtained.

By providing the radical sealing narrow portions 47a and 47b as described above, the degree of freedom of the radical sealing member 47 to deform increases, and hence the radical sealing member 47 can undergo compressive deformation easily. The following ability of the radical sealing member 47 during compression can thus be improved, and hence the radical sealing member 47 can be made to have excellent durability, and moreover the compressive load on the radical sealing member 47 can be reduced.

The horizontal direction width D1 of each of the refuge spaces 48d and 48e is set to at least a value such that an atmosphere-side end of the radical sealing member 47 and the atmosphere-side lump portion 48b of the vacuum sealing member 48 do not contact one another in the natural length state (the state shown in FIG. 3), and in the installed state of the sealing part 46 (the state shown in FIG. 2). By providing the refuge spaces 48d and 48e as described above, it becomes possible for the radical sealing member 47 and the vacuum sealing member 48 to move independently of one another even in the installed state of the sealing part 46, and hence even in the case, for example, that the vacuum sealing member 48 has fallen in due to uneven tightening, the radical sealing member 47 does not follow the movement of the vacuum sealing member 48, but rather the state of the contacting surfaces 47c and 47d being in contact with the vessel lid 31 and the bottom face 49b of the sealing groove 49 respectively can be maintained well. As a result, the shielding performance of the radical sealing member 47 to radicals can be made to be stable over a long time period.

The minimum width D2 of each of the refuge spaces 48f and 48g is set to a value such as to be greater than 0 in the natural length state (the state shown in FIG. 3), and also preferably in the installed state of the sealing part 46 (the state shown in FIG. 2). In the sealing part 46, due to a rubber material (the FKM) and a resin material (the PTFE) being tightened together, the compressive load tends to be greater than in the case of tightening a sealing part made of only a rubber material, but by providing the refuge spaces 48f and 48g and setting the minimum width D2 of the refuge spaces 48f and 48g as described above, the reaction force from the resin material (the radical sealing member 47) is kept down and hence the tightening force required for the tightening can be reduced. Moreover, by forming the refuge spaces 48f and 48g as described above, sufficient space for when the radical sealing member 47 deforms can be secured, and hence the deformation of the radical sealing member 47 can be made to be stable, and thus the reaction force from the radical sealing member 47 can be further reduced.

Fluorine radicals and/or oxygen radicals (hereinafter referred to merely as "radicals") are produced in the vacuum vessel 11 of the plasma processing apparatus 10. The FKM constituting the vacuum sealing member 48 is readily worn away by such radicals. The radicals flow from the vacuum side toward the atmosphere side in FIG. 2, but because the radical sealing member 47 is disposed on the vacuum side and is in close contact with both the vessel lid 31 and the bottom face 49b of the sealing groove 49, the radical sealing member 47 prevents the radicals from reaching the vacuum sealing member 48 disposed on the atmosphere side. In particular, the PTFE constituting the radical sealing member 47 has excellent resistance to the radicals, and hence the radical sealing member 47 is not worn away. Moreover, although the recoverability of PTFE decreases through creeping upon being continually compressed over a long time period, according to the sealing part 46, because the vacuum-side lump portion 48a of the vacuum sealing member 48 is press-fitted into the opening of the substantially U-shaped cross section of the radical sealing member 47, the recoil force from the vacuum-side lump portion 48a makes up for the reduced recoverability of the radical sealing member 47. The radical sealing member 47 can thus prevent the radicals from reaching the vacuum sealing member 48 disposed on the atmosphere side over a long time period.

Moreover, according to the plasma processing apparatus 10, the vacuum sealing member 48 is disposed on the atmosphere side and is in close contact with both the vessel lid 31 and the bottom face 49b of the sealing groove 49. Moreover, as described above, the radicals do not reach the vacuum sealing member 48, and hence the vacuum sealing member 48 is not worn away. The vacuum sealing member 48 can thus prevent outside air from getting into the vacuum vessel 11 over a long time period.

According to the sealing part 46 of the present embodiment, the sealing part 46 has the radical sealing member 47 which is disposed on the vacuum side and is made of PTFE having excellent resistance to radicals, and the vacuum sealing member 48 which is disposed on the atmosphere side and is made of FKM. The radical sealing member 47 prevents the radicals from reaching the vacuum sealing member 48, and hence the vacuum sealing member 48 can be prevented from being worn away by the radicals, whereby the need to use radical-resistant FFKM can be eliminated. Moreover, the radical sealing member 47 and the vacuum sealing member 48 are fitted together, and hence the sealing part 46 can be handled as a single body, and moreover can be made small in size. As a result, the sealing part 46 does not require a predetermined sealing space as would be required for a double sealing structure, the sealing part 46 is inexpensive, and excellent durability can be secured.

According to the sealing part 46 described above, the radical sealing member 47 has a substantially U-shaped cross section that opens out on the atmosphere side, and the vacuum-side lump portion 48a of the vacuum sealing member 48 is press-fitted into the opening of the substantially U-shaped cross section. Consequently, even if the recoverability of the radical sealing member 47 decreases through creeping, the reduced recoverability of the radical sealing member 47 can be made up for by the recoil force from the press-fitted vacuum-side lump portion 48a. As a result, the radical sealing member 47 can prevent the radicals from reaching the vacuum sealing member 48 disposed on the atmosphere side over a long time period, and hence the durability of the sealing part 46 can be maintained over a long time period.

Moreover, according to the sealing part 46, the radical sealing member 47 is made of PTFE. PTFE has excellent resistance to the radicals, and hence is hardly worn away by the radicals. Wearing away of the FKM constituting the vacuum sealing member 48 by the radicals can thus be reliably prevented, and hence yet better durability can be secured for the sealing part 46.

Furthermore, the sealing part 46 has around the perimeter of the vacuum sealing member 48 the refuge spaces 48d, 48e, 48f and 48g which are defined by the vacuum sealing member 48 alone or by the vacuum sealing member 48 and the radical sealing member 47 in collaboration. As a result, portions protruding out from the vacuum sealing member 48 when the vacuum sealing member 48 is compressed in the vertical direction can enter into the refuge spaces 48d, 48e, 48f and 48g, whereby the vacuum sealing member 48 can undergo compressive deformation easily. Moreover, the radical sealing member 47 has the radical sealing narrow portions 47a and 47b in the substantially U-shaped cross section, whereby the radical sealing member 47 can also undergo compressive deformation easily. Consequently, in the sealing groove 49, the ability of the radical sealing member 47 to follow the bottom face 49b of the sealing groove 49 and the vessel lid 31 can be improved, and hence excellent durability can be secured, and moreover the compressive loads on the radical sealing member 47 and the vacuum sealing member 48 can be reduced.

Moreover, according to the sealing part 46, the vacuum sealing member 48 made of FKM realizes a vacuum seal. Even if a surface with which the FKM is in close contact has high surface roughness, the vacuum seal can be realized. As a result, the sealing part 46 can realize an excellent vacuum seal. Moreover, there is no need to make the surface roughness of the vessel lid 31 and the bottom face 49b of the sealing groove 49 as low as possible. As a result, control of the surface roughness of the vessel lid 31 and the sealing groove 49 becomes easy, and hence the cost of manufacturing the plasma processing apparatus 10 can be reduced.

In the sealing part 46 described above, the radical sealing member 47 is made of PTFE. However, the radical sealing member 47 may be made of any radical-resistant material, for example may also be made of any of a tetrafluoroethylene/perfluoroalkyl vinyl ether copolymer (PFA), a tetrafluoroethylene/hexafluoropropylene copolymer (FEP), a tetrafluoroethylene/ethylene copolymer (ETFE), polyvinylidene fluoride (PVDF), and polychlorotrifluoroethylene (PCTFE). These materials can be procured easily and inexpensively, and hence the sealing part 46 can be made less expensive.

Moreover, in the sealing part 46 described above, the vacuum sealing member 48 is made of FKM. However, the vacuum sealing member 48 may be made of any material having vacuum sealing ability, for example may also be made of tetrafluoroethylene-propylene type rubber (FEPM). These materials can also be procured easily and inexpensively, and hence the sealing part 46 can be made less expensive.

Next, variations of the sealing part 46 will be described.

Figure 4:
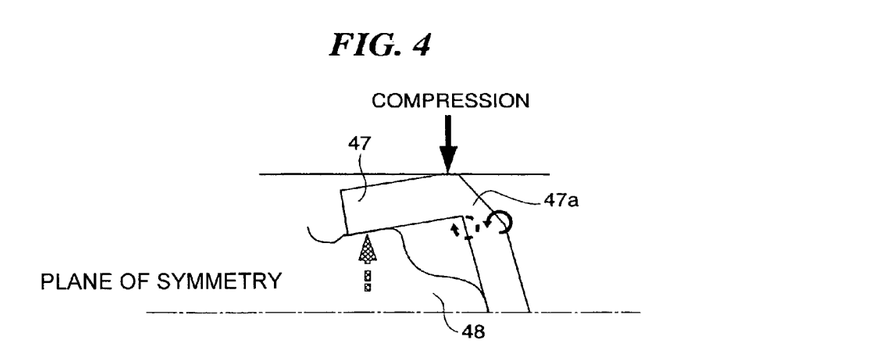
FIG. 4 is a view showing an installed state of the sealing part shown in FIG. 2.

As shown in FIGS. 2 and 3, in the above embodiment, the radical sealing member 47 of the sealing part 46 has one radical sealing narrow portion 47a or 47b as a bending portion on each side about a plane of symmetry of the sealing part 46 (see FIG. 4). In this case, as shown in FIG. 4, in the installed state of the sealing part 46 (the state shown in FIG. 2), cases arise in which the contacting surface 47c or 47d of the radical sealing member 47 is not in surface contact with the opposing surface (the vessel lid 31 or the bottom face 49b) due to a compressive force from the vessel lid 31 or the bottom face 49b and a restoring force from the vacuum sealing member 48. To combat this, in the present variations, as shown in FIGS. 6A to 6D, described below, the radical sealing member 47 may be made to have three or more bending portions provided symmetrically about the plane of symmetry of the sealing part 46, whereby in the installed state of the sealing part 46 (the state shown in FIG. 2), the contacting surfaces 47c and 47d of the radical sealing member 47 can be made to be in surface contact with the vessel lid 31 and the bottom face 49b respectively, and hence a good radical shielding effect can be obtained.

Figure 5:
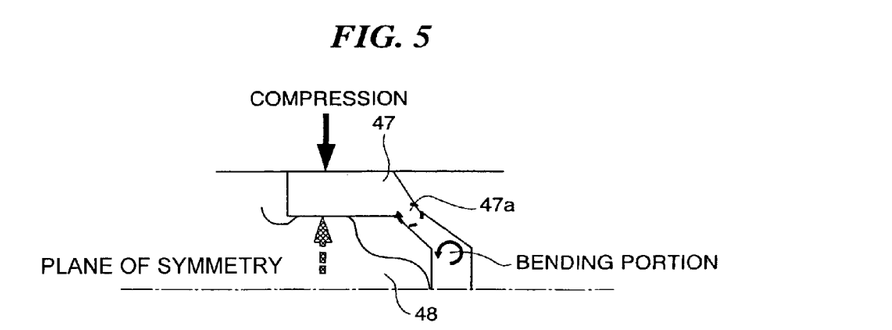
FIG. 5 is a view showing an installed state of a variation of the sealing part shown in FIG. 2.

This is because in the case that the radical sealing member 47 has three or more bending portions provided symmetrically about the plane of symmetry of the sealing part 46, as shown in FIG. 5, moments arising on the radical sealing member 47 due to the compressive force from each opposing member (the vessel lid 31 or the bottom face 49b) and the restoring force from the vacuum sealing member 48 are distributed into the bending portions, and hence each of the contacting surfaces 47c and 47d of the radical sealing member 47 follows the respective opposing member.

Figure 6A:
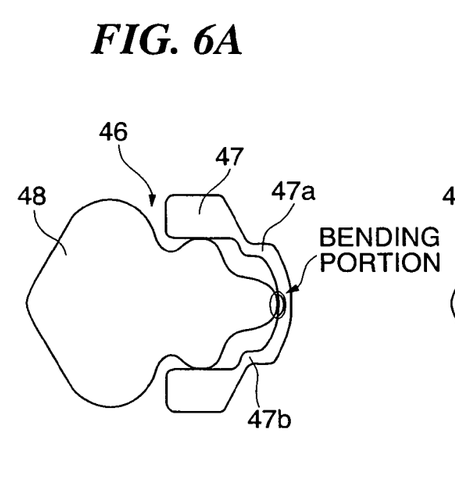
FIGS. 6A to 6D are sectional views showing variations of the sealing part shown in FIG. 2.
Figure 6B:
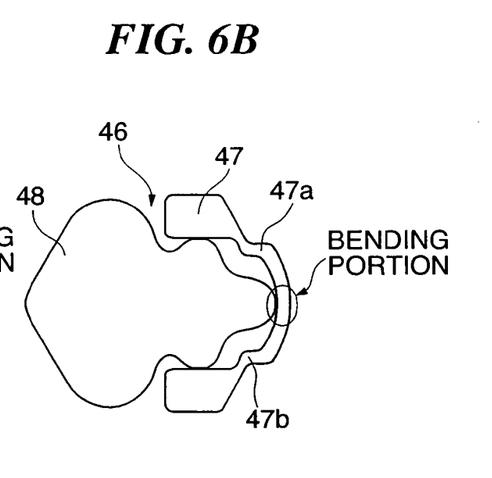
Figure 6C:
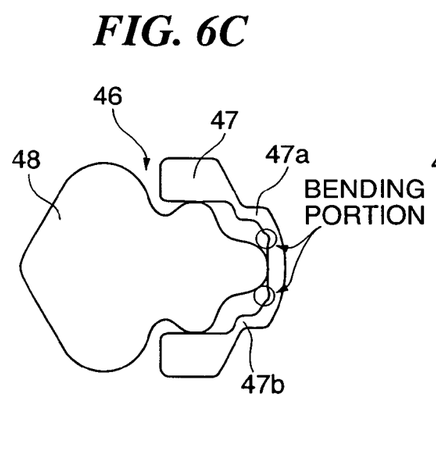
Figure 6D:
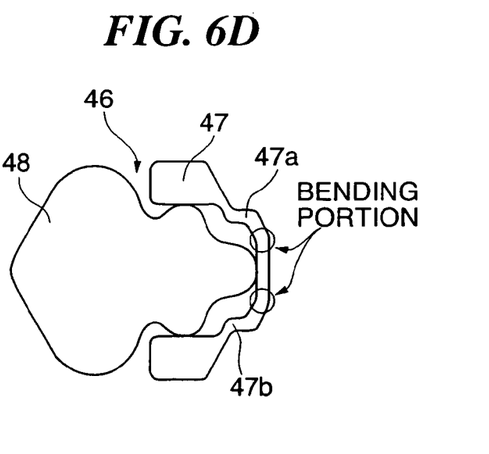

Specific variations of the sealing part 46 are shown in FIGS. 6A to 6D. As shown in FIGS. 6A and 6B, the radical sealing member 47 may have, in addition to the radical sealing narrow portions 47a and 47b, one more bending portion formed at the plane of symmetry. Alternatively, as shown in FIGS. 6C and 6D, the radical sealing member 47 may have, in addition to the radical sealing narrow portions 47a and 47b, two more bending portions provided symmetrically about the plane of symmetry.

The bending portions are each not limited to being comprised of a narrow portion, but each of the bending portions rather may be comprised of a notch or a recess (see FIGS. 6A and 6C), or may be comprised of an angular portion (see FIGS. 6B and 6D), or may be of another shape.

In the above, the case that the sealing part 46 is housed in the space defined by the sealing groove 49 and the vessel lid 31 has been described. However, the site at which the sealing part 46 is used is not limited to this, but rather the sealing part 46 may be used at any site where sealing of a vacuum from the atmosphere is required. For example, the sealing part 46 may be used in a joint of an exhaust system that exhausts gas out of the vacuum vessel 11. A KF flange joint structure is widely used as such a joint of an exhaust system.

Figure 7:
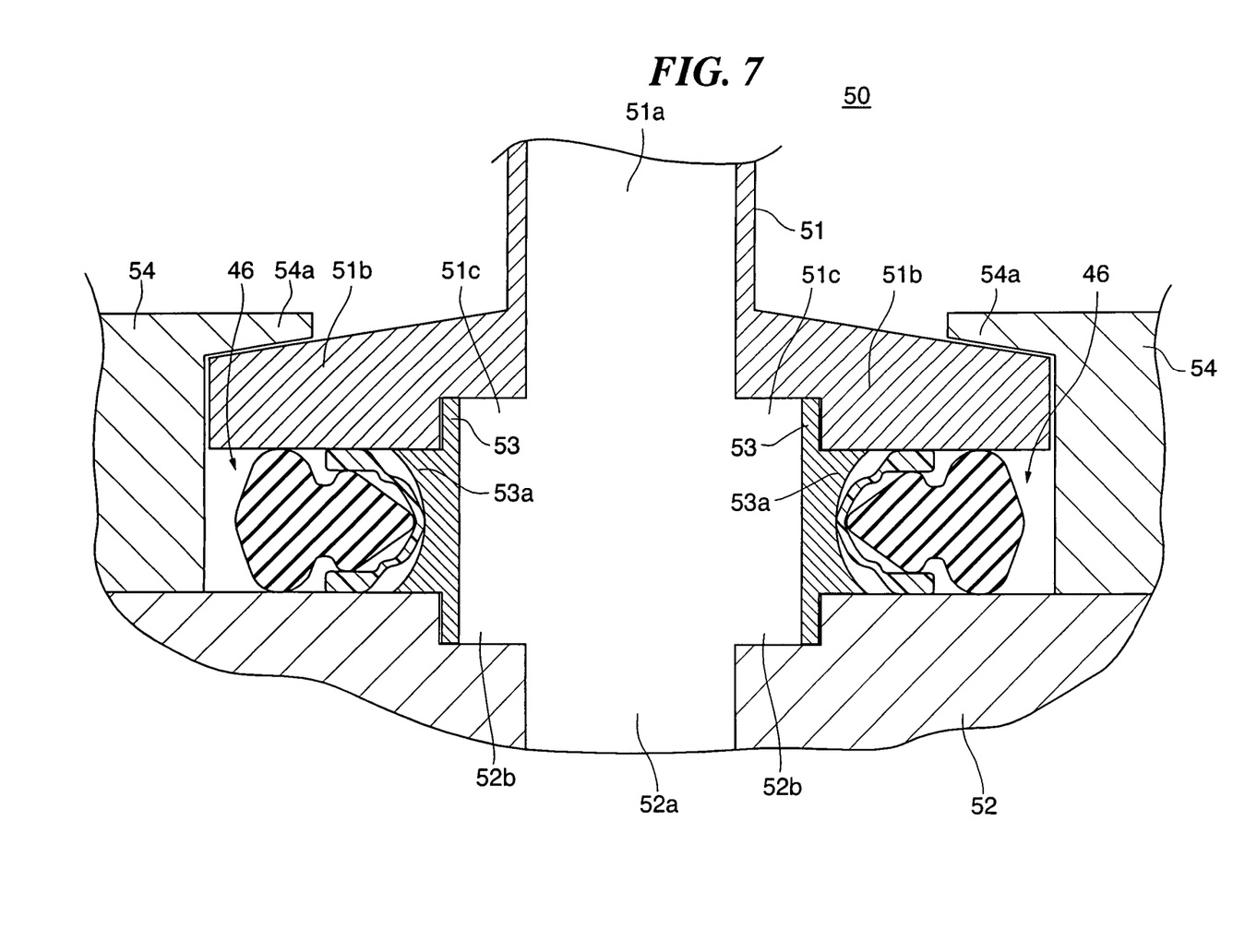
FIG. 7 is a sectional view showing a case that the sealing part shown in FIG. 2 is used in a KF flange joint structure.

FIG. 7 is a sectional view showing a case that the sealing part shown in FIG. 2 is used in a KF flange joint structure.

As shown in FIG. 7, the KF flange joint structure 50 is comprised of a pipe 51 having a hole 51a and a circular flange portion 51b that is coaxial with the hole 51a, a receiving portion 52 having a hole 52a that communicates with the hole 51a of the pipe 51, a centering pipe 53 located between the pipe 51 and the receiving portion 52, and a substantially ring-shaped fastening member 54 having an inner flange portion 54a.

The pipe 51 has in an end face thereof an insertion hole 51c that is coaxial with the hole 51a and has a diameter greater by a predetermined amount than that of the hole 51a, and the receiving portion 52 similarly has in an end face thereof an insertion hole 52b that is coaxial with the hole 52a and has the same diameter as the insertion hole 51c. An outside diameter of the centering pipe 53 is set to be smaller by a predetermined amount than the diameter of the insertion holes 51c and 52b. Centering of the hole 51a of the pipe 51 with the hole 52a of the receiving portion 52 can thus be carried out by inserting upper and lower ends of the centering pipe 53 into the insertion holes 51c and 52b respectively.

Moreover, the centering pipe 53 has a projecting portion 53a that projects out in a horizontal direction in FIG. 7. The projecting portion 53a has a predetermined length in a vertical direction in FIG. 7, and is shaped such that upper and lower ends thereof extend along the horizontal direction in FIG. 7, and a side thereof has a bow-shaped cross section. The inner flange portion 54a of the fastening member 54 presses against a peripheral portion of the circular flange portion 51b of the pipe 51 in a state in which the pipe 51 has been attached to the receiving portion 52 via the centering pipe 53. As a result, the upper and lower ends of the projecting portion 53a contact the end face of the pipe 51 and the end face of the receiving portion 52 respectively so that a spacing between the pipe 51 and the receiving portion 52 is maintained at a predetermined value.

Moreover, with the KF flange joint structure 50, the hole 51*a* is communicated with the inside of the vacuum vessel 11. The pressure inside the hole 51*a* and the hole 52*a* is thus substantially a vacuum, and moreover radicals flow into the hole 51*a* and the hole 52*a*. In FIG. 7, the holes 51*a* and 52*a* thus correspond to the vacuum side, and the outside of the pipe 51 corresponds to the atmosphere side.

Here, because the sealing part 46 is small in size due to the radical sealing member 47 and the vacuum sealing member 48 being fitted together as described earlier, the sealing part 46 does not require a predetermined sealing space. The sealing part 46 can thus be housed in a space defined by the end face of the pipe 51, the end face of the receiving portion 52, and the bow-shaped side of the projecting portion 53*a* of the centering pipe 53. That is, the sealing part 46 can be used without changing the structure of the KF flange joint structure 50.

In the KF flange joint structure 50, the distance between the end face of the pipe 51 and the end face of the receiving portion 52, i.e. the length of the projecting portion 53*a* in the vertical direction, is set to be shorter by a predetermined length than the natural length of the radical sealing member 47 in the vertical direction and the natural length of the vacuum sealing member 48 in the vertical direction, whereby when the sealing part 46 is housed in the space defined by the end face of the pipe 51, the end face of the receiving portion 52, and the bow-shaped side of the projecting portion 53*a* of the centering pipe 53, the radical sealing member 47 and the vacuum sealing member 48 are each compressed in the vertical direction. As a result, each of the radical sealing member 47 and the vacuum sealing member 48 produces a recoil force, and hence each of the radical sealing member 47 and the vacuum sealing member 48 is made to be in close contact with both the end face of the pipe 51 and the end face of the receiving portion 52 due to the recoil force. The radical sealing member 47 can thus prevent the radicals flowing into the holes 51*a* and 52*a* from reaching the vacuum sealing member 48 over a long time period. Moreover, the vacuum sealing member 48 can prevent outside air from getting into the holes 51*a* and 52*a* over a long time period.

Next, a sealing part according to a second embodiment of the present invention will be described.

The present embodiment is basically similar to the first embodiment described above in terms of construction and operation, differing from the first embodiment described above only in that a corrosive gas is used rather than a reactive active gas in the substrate processing apparatus. Description of features of the structure and operation that are the same as in the first embodiment will thus be omitted, with only features of the structure and operation that are different to in the first embodiment being described below.

Figure 8:
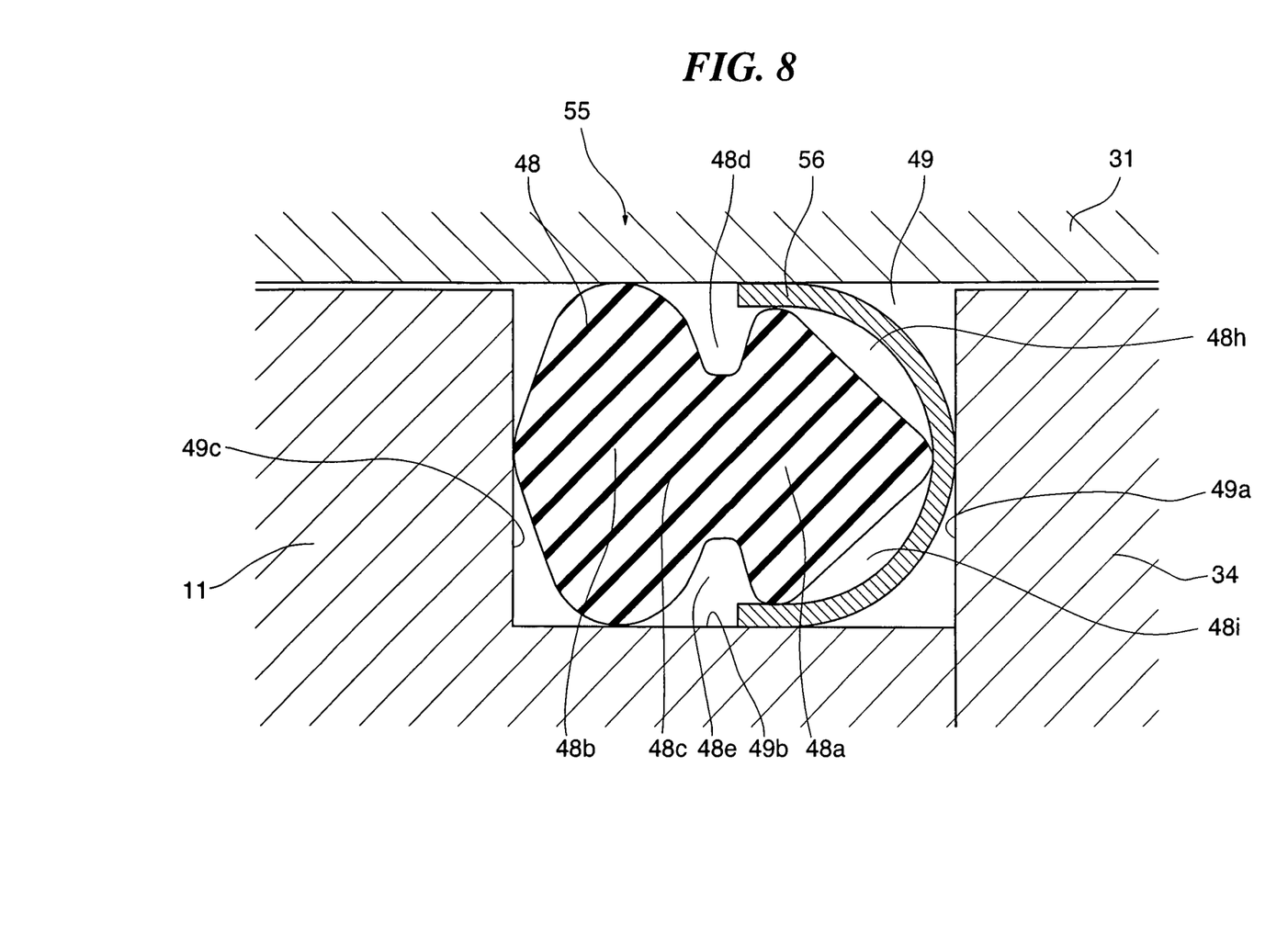
FIG. 8 is an enlarged sectional view of a sealing part according to a second embodiment of the present invention.

FIG. 8 is an enlarged sectional view of the sealing part according to the present embodiment. Note that a region in which the pressure is reduced substantially to a vacuum and the corrosive gas is present is located to at the top of the drawings, and a region open to the atmosphere is located at the bottom of the drawings. Hereinafter, the region to the top of the drawing will thus be referred to as "the vacuum side", and the region to the bottom of the drawing as "the atmosphere side". Moreover, the up/down direction in the drawing will be referred to as the "horizontal direction", and the left/right direction in the drawing as the "vertical direction".

As shown in FIG. 8, the sealing part 55 has a corrosive gas sealing member 56 having a substantially U-shaped cross section that opens out on the atmosphere side, and the vacuum sealing member 48. The corrosive gas sealing member 56 is disposed on the vacuum side, and the vacuum sealing member 48 is disposed on the atmosphere side. The corrosive gas sealing member 56 is made of austenite type stainless steel, and the vacuum sealing member 48 is made of FKM.

The sealing part 55 is, for example, housed in the space defined by the vessel lid 31, and the sealing groove 49 having a rectangular cross section formed in the vacuum vessel 11. The vessel lid 31 is disposed above the sealing part 55, the vessel lid 31 contacting an upper portion of the sealing part 55. Specifically, the bottom face 49*b* of the sealing groove 49 contacts the corrosive gas sealing member 56 and the vacuum sealing member 48, and the vessel lid 31 also contacts the corrosive gas sealing member 56 and the vacuum sealing member 48.

The distance between the vessel lid 31 and the bottom face 49*b* of the sealing groove 49 is set to be shorter by a predetermined length than the natural length of the corrosive gas sealing member 56 in the vertical direction and the natural length of the vacuum sealing member 48 in the vertical direction, whereby when the sealing part 55 is housed in the space defined by the sealing groove 49 and the vessel lid 31, the corrosive gas sealing member 56 and the vacuum sealing member 48 are each compressed in the vertical direction. As a result, each of the corrosive gas sealing member 56 and the vacuum sealing member 48 produces a recoil force, and hence each of the corrosive gas sealing member 56 and the vacuum sealing member 48 is made to be in close contact with both the vessel lid 31 and the bottom face 49*b* of the sealing groove 49 due to the recoil force.

The vacuum-side lump portion 48*a* of the vacuum sealing member 48 is press-fitted into the opening of the substantially U-shaped cross section of the corrosive gas sealing member 56. As a result, the corrosive gas sealing member 56 and the vacuum sealing member 48 are fitted together. Moreover, parts of the vacuum-side lump portion 48*a* of the vacuum sealing member 48 are separated from parts of the corrosive gas sealing member 56 so as to form refuge spaces 48*h* and 48*i*.

Portions protruding out from the vacuum sealing member 48 when the vacuum sealing member 48 is compressed in the vertical direction enter into the refuge spaces 48*d*, 48*e*, 48*h* and 48*i* located around the perimeter of the vacuum sealing member 48 as described above, whereby the refuge spaces 48*d*, 48*e*, 48*h* and 48*i* promote compressive deformation of the vacuum sealing member 48.

The FKM constituting the vacuum sealing member 48 is readily worn away by the corrosive gas which flows from the vacuum side toward the atmosphere side in FIG. 8, but because the corrosive gas sealing member 56 is disposed on the vacuum side and is in close contact with both the vessel lid 31 and the bottom face 49*b* of the sealing groove 49, the corrosive gas sealing member 56 prevents the corrosive gas from reaching the vacuum sealing member 48 disposed on the atmosphere side. In particular, the austenite type stainless steel constituting the corrosive gas sealing member 56 has excellent resistance to the corrosive gas, and hence the corrosive gas sealing member 56 is not worn away. The corrosive gas sealing member 56 can thus prevent the corrosive gas from reaching the vacuum sealing member 48 disposed on the atmosphere side over a long time period.

According to the sealing part 55 of the present embodiment, the sealing part 55 has the corrosive gas sealing member 56 which is disposed on the vacuum side and is made of austenite type stainless steel having excellent resistance to the corrosive gas, and the vacuum sealing member 48 which is disposed on the atmosphere side and is made of FKM. The corrosive gas sealing member 56 prevents the corrosive gas from reaching the vacuum sealing member 48, and hence the vacuum sealing member 48 can be prevented from being worn away by the corrosive gas, whereby the need to use a corrosive gas-resistant elastomer material can be eliminated. Moreover, the corrosive gas sealing member 56 and the vacuum sealing member 48 are fitted together, and hence the sealing part 55 can be handled as a single body, and moreover can be made small in size. As a result, the sealing part 55 does not require a predetermined sealing space as would be required for a double sealing structure, the sealing part 55 is inexpensive, and excellent durability can be secured.

Moreover, according to the sealing part 55, the corrosive gas sealing member 56 is made of austenite type stainless steel. Austenite type stainless steel has excellent resistance to the corrosive gas, and hence is hardly worn away by the corrosive gas. Wearing away of the FKM constituting the vacuum sealing member 48 by the corrosive gas can thus be reliably prevented, and hence yet better durability can be secured for the sealing part 55.

Furthermore, the sealing part 55 has around the perimeter of the vacuum sealing member 48 the refuge spaces 48d, 48e, 48h and 48i which are defined by the vacuum sealing member 48 alone or by the vacuum sealing member 48 and the corrosive gas sealing member 56 in collaboration. As a result, portions protruding out from the vacuum sealing member 48 when the vacuum sealing member 48 is compressed in the vertical direction can enter into the refuge spaces 48d, 48e, 48h and 48i, whereby the vacuum sealing member 48 can undergo compressive deformation easily. The vacuum sealing member 48 can thus be prevented from being crushed, and hence yet better durability can be secured.

In the sealing part 55 described above, the corrosive gas sealing member 56 is made of austenite type stainless steel. However, the corrosive gas sealing member 56 may be made of any corrosive gas-resistant material, for example may also be made of any of stainless steel of a type other than austenite, nickel, or aluminum. These materials can be procured easily and inexpensively, and hence the sealing part 55 can be made less expensive.

In the above, the case that the sealing part 55 is housed in the space defined by the sealing groove 49 and the vessel lid 31 has been described. However, the site at which the sealing part 55 is used is not limited to this, but rather the sealing part 55 may be used at any site where sealing of a vacuum from the atmosphere is required. For example, it goes without saying that the sealing part 55 may also be used in the KF flange joint structure 50 described earlier.

In the embodiments described above, the substrates processed are semiconductor wafers. However, the substrates processed are not limited thereto, but rather may also be, for example, LCD (liquid crystal display) or FPD (flat panel display) glass substrates.

What is claimed is:

1. A sealing part in a substrate processing apparatus that has a reduced pressure vessel in which is present a high-elasticity polymeric material-eroding eroding substance and carries out predetermined processing on a substrate housed in the reduced pressure vessel, the sealing part sealing an inside of the reduced pressure vessel from an outside, the sealing part comprising:
    a first member that is disposed on an inside side of the reduced pressure vessel and is resistant to the eroding substance, the first member comprising a substantially U-shaped cross section that opens out on the outside side of the pressure vessel and has at least one narrow portion which bends for promoting compressive deformation thereof;
    a second member made of the high-elasticity polymeric material that is disposed on an outside side of the reduced pressure vessel; and
    at least one predetermined space formed between at least part of said first member and at least part of said second member;
    wherein at least part of said second member enters into an opening of said U-shaped cross section of said first member,
    wherein said at least one predetermined space is an enclosed space formed by contacting said first member and said second member with each other in at least two portions, the enclosed space being disposed inside said first member, and
    wherein said at least one predetermined space shrinks when said first member and said second member are compressed.

2. A sealing part as claimed in claim 1, wherein said U-shaped cross section of said first member has at least three bending portions including at least one pair of narrow portions that are provided symmetrically regarding a symmetry plane including a center of said U-shaped cross section.

3. A sealing part as claimed in claim 1, wherein the eroding substance is an active species produced from a reactive active gas, and said first member is made of a fluororesin.

4. A sealing part as claimed in claim 3, wherein said fluororesin is one selected from the group consisting of polytetrafluoroethylene, a tetrafluoroethylene/perfluoroalkyl vinyl ether copolymer, a tetrafluoroethylene/hexafluoropropylene copolymer, a tetrafluoroethylene/ethylene copolymer, polyvinylidene fluoride, and polychlorotrifluoroethylene.

5. A sealing part as claimed in claim 3, wherein said high-elasticity polymeric material is one selected from the group consisting of vinylidene fluoride type rubber, and tetrafluoroethylene-propylene type rubber.

6. A sealing part as claimed in claim 1, wherein the eroding substance is a corrosive gas, and said first member is made of a corrosion-resistant metal.

7. A sealing part as claimed in claim 6, wherein said corrosion-resistant metal is one selected from the group consisting of stainless steel, nickel, and aluminum.

8. A sealing part as claimed in claim 6, wherein said high-elasticity polymeric material is one selected from the group consisting of vinylidene fluoride type rubber, and tetrafluoroethylene-propylene type rubber.

9. A sealing part as claimed in claim 1, wherein said second member has a neck portion.

10. A sealing part as claimed in claim 9, wherein a thickness L3 of the neck portion and a maximum thickness L2 of said second member satisfy $0.95 \times L2 \geq L3 \geq 0.3 \times L2$.

11. A sealing part as claimed in claim 10, wherein the thickness L3 of the neck portion satisfies and the maximum thickness L2 of said second member satisfy $0.9 \times L2 \geq L3 \geq 0.45 \times L2$.

12. A sealing part as claimed in claim 1, wherein said first member and said second member move independently of one another.

13. A sealing part as claimed in claim 1, wherein a thickness W1 of the narrow portion satisfies $2.0 \text{ mm} \geq W1 \geq 0.05 \text{ mm}$.

14. A sealing part as claimed in claim 13, wherein the thickness W1 of the narrow portion satisfies $1.5 \text{ mm} \geq W1 \geq 0.1 \text{ mm}$.

15. A sealing part as claimed in claim 1, wherein the enclosed space is formed by contacting said first member and said second member with each other in three portions.

16. A substrate processing apparatus comprising:
a reduced pressure vessel in which is present a high-elasticity polymeric material-eroding eroding substance;
a processing apparatus that carries out predetermined processing on a substrate housed in said reduced pressure vessel; and
a sealing part that seals an inside of said reduced pressure vessel from an outside;
wherein said sealing part has a first member that is disposed on an inside side of said reduced pressure vessel and is resistant to the eroding substance, the first member comprising a substantially U-shaped cross section that opens out on the outside side of the pressure vessel and has at least one narrow portion which bends for promoting compressive deformation thereof, and a second member made of the high-elasticity polymeric material that is disposed on an outside side of said reduced pressure vessel, and at least one predetermined space formed between at least part of said first member and at least part of said second member,
wherein said at least one predetermined space is an enclosed space formed by contacting said first member and said second member with each other in at least two portions, the enclosed space being disposed inside said first member, and
wherein said at least one predetermined space shrinks when said first member and said second member are compressed.

17. A substrate processing apparatus as claimed in claim 16, wherein the eroding substance is an active species produced from a reactive active gas, and said first member is made of a fluororesin.

18. A substrate processing apparatus as claimed in claim 16, wherein the eroding substance is a corrosive gas, and said first member is made of a corrosion-resistant metal.

19. A substrate processing apparatus as claimed in claim 16, wherein said first member and said second member move independently of one another.

20. A substrate processing apparatus as claimed in claim 16, wherein the enclosed space is formed by contacting said first member and said second member with each other in three portions.

* * * * *